United States Patent
Bohsali et al.

(10) Patent No.: US 7,863,993 B1
(45) Date of Patent: Jan. 4, 2011

(54) OSCILLATOR FOR PROVIDING OSCILLATION SIGNAL WITH CONTROLLABLE FREQUENCY

(75) Inventors: Mounir Bohsali, Albany, CA (US); Ali Kiaei, Cupertino, CA (US); Gerard Socci, Palo Alto, CA (US); Masood Yousefi, Cupertino, CA (US); Ali Djabbari, Saratoga, CA (US); Ahmad Bahai, Lafayette, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/206,448

(22) Filed: Sep. 8, 2008

(51) Int. Cl.
*H03B 5/36* (2006.01)
*H03C 3/22* (2006.01)

(52) U.S. Cl. .............................. 331/116 FE; 331/36 C; 331/109; 331/158; 331/177 V

(58) Field of Classification Search ............... 331/36 C, 331/117 FE, 117 R, 177 V, 15, 109, 116 R, 331/116 FE, 154, 158, 182, 183
See application file for complete search history.

(56) References Cited

U.S. PATENT DOCUMENTS

| | | | | | |
|---|---|---|---|---|---|
| 4,104,599 | A | * | 8/1978 | Tagawa | 331/116 FE |
| 6,466,099 | B2 | * | 10/2002 | Festag | 331/117 R |
| 6,861,917 | B2 | * | 3/2005 | Stevenson et al. | 331/183 |
| 7,633,352 | B2 | * | 12/2009 | El Rai | 331/181 |

* cited by examiner

*Primary Examiner*—Robert Pascal
*Assistant Examiner*—Levi Gannon
(74) *Attorney, Agent, or Firm*—Vedder Price, P.C.

(57) ABSTRACT

An oscillator, including amplifier circuitry and resonant circuitry, for providing an oscillation signal with a controllable frequency while maintaining a substantially constant steady state magnitude. Controllable reactive circuitry, included as part of the amplifier circuitry, has a reactance which can be controlled such that the resistive components of the amplifier circuitry and resonant circuitry impedances remain substantially equal. When in the form of serially coupled, controllable capacitances, the controllable reactive circuitry is controlled such that a ratio of changes in the controllable capacitances is approximately equal to a negative ratio of the capacitance values.

5 Claims, 2 Drawing Sheets

OSCILLATOR FOR PROVIDING OSCILLATION SIGNAL WITH CONTROLLABLE FREQUENCY

BACKGROUND OF THE INVENTION

1. Field of the Invention

The present invention relates to analog oscillators, and in particular, to analog oscillators having analog or digital voltage controlled frequencies.

2. Related Art

Analog oscillators with controllable frequencies are typically controlled by either an analog voltage or a digital signal. Tuning the frequency of such oscillators is generally achieved by changing the value of a reactive element, such as a capacitor. Changes in the value of the reactive element are usually small in magnitude, but even small changes have the undesirable effect of causing changes in the magnitude of the oscillation signal generated by the oscillator. Such changes in signal magnitude are often abrupt, particularly, when the control voltage is in the form of a digital signal with discrete, rather than continuous, signal changes.

SUMMARY

In accordance with the presently claimed invention, an oscillator, including amplifier circuitry and resonant circuitry, is provided for providing an oscillation signal with a controllable frequency while maintaining a substantially constant steady state magnitude. Controllable reactive circuitry, included as part of the amplifier circuitry, has a reactance which can be controlled such that the resistive components of the amplifier circuitry and resonant circuitry impedances remain substantially equal. When in the form of serially coupled, controllable capacitances, the controllable reactive circuitry is controlled such that a ratio of changes in the controllable capacitances is approximately equal to a negative ratio of the capacitance values.

In accordance with one embodiment of the presently claimed invention, an oscillator for providing an oscillation signal with a controllable frequency includes:

resonant circuitry;

amplifier circuitry coupled to the resonant circuitry and including controllable reactive circuitry, wherein the controllable reactive circuitry has a controllable reactance responsive to one or more control signals; and control circuitry coupled to the amplifier circuitry to provide the one or more control signals with a plurality of values, wherein for each one of the plurality of control signal values the controllable reactance has a corresponding magnitude such that the amplifier circuitry provides an oscillation signal with a substantially constant steady state magnitude.

In accordance with another embodiment of the presently claimed invention, an oscillator for providing an oscillation signal with a controllable frequency includes:

resonant circuitry having an impedance with resistive and reactive components;

amplifier circuitry coupled to the resonant circuitry, including controllable reactive circuitry and having an impedance with resistive and reactive components, wherein the controllable reactive circuitry has a controllable reactance responsive to one or more control signals; and control circuitry coupled to the amplifier circuitry to provide the one or more control signals with a plurality of values, wherein for each one of the plurality of control signal values the controllable reactance has a corresponding magnitude such that the resistive component of the amplifier circuitry impedance remains substantially equal in magnitude to the resistive component of the resonant circuitry impedance.

In accordance with another embodiment of the presently claimed invention, an oscillator for providing an oscillation signal with a controllable frequency includes:

resonant circuitry;

amplifier circuitry coupled to the resonant circuitry and including first and second serially coupled controllable capacitances responsive to one or more control signals; and control circuitry coupled to the amplifier circuitry to provide the one or more control signals with a plurality of values, wherein the first and second serially coupled controllable capacitances have a first value C1 and a second value C2, respectively, in accordance with a change between first and second ones of the plurality of control signal values, the first capacitance value C1 changes from a first initial value C1$a$ to a first subsequent value C1$b$ for a first value change of C1$b$-C1$a$, and the second capacitance value C2 changes from a second initial value C2$a$ to a second subsequent value C2$b$ for a second value change of C2$b$-C2$a$, and a ratio (C2$b$-C2$a$)/(C1$b$-C1$a$) of the first and second capacitance value changes is approximately equal to a negative ratio (−C2)/(C1) of the first and second capacitance values.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
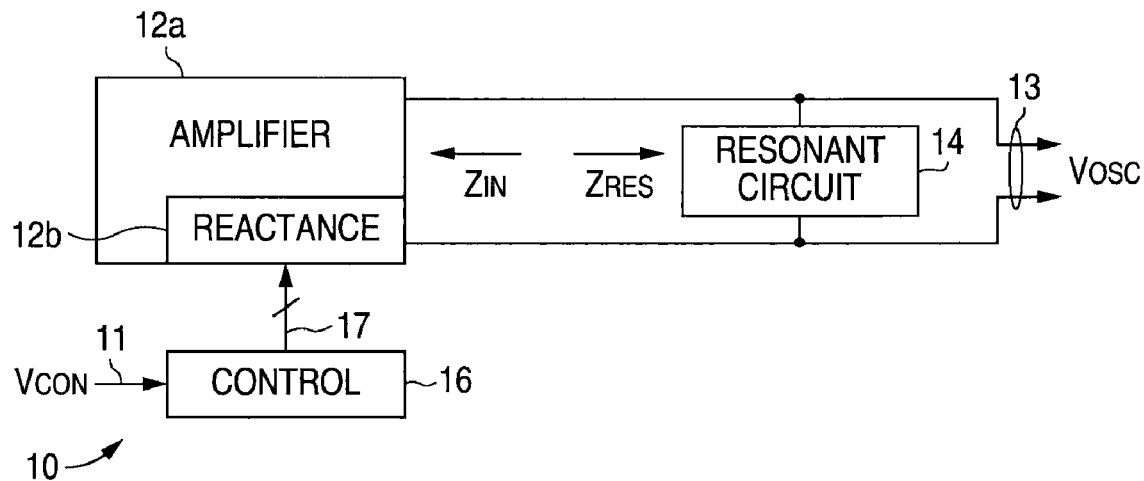
FIG. 1 is a functional block diagram of an oscillator in accordance with one embodiment of the presently claimed invention.

Referring to FIG. 1, in accordance with the presently claimed invention, an oscillator 10 includes an amplifier 12a, which, in turn, includes a controllable reactance 12b, plus resonant circuitry 14 and control circuitry 16, interconnected substantially as shown. The resonant circuitry 14 includes capacitive and inductive elements necessary for the oscillator 10 to provide its analog oscillation signal 13 at the desired frequency. The control circuitry 16, itself controllable by an analog control signal 11 (or one or more digital control signals, as discussed in more detail below), provides one or more control signals 17 to control the reactive circuit elements 12b (discussed in more detail below), which, in turn, control the frequency of oscillation of the output signal 13.

Figure 2:
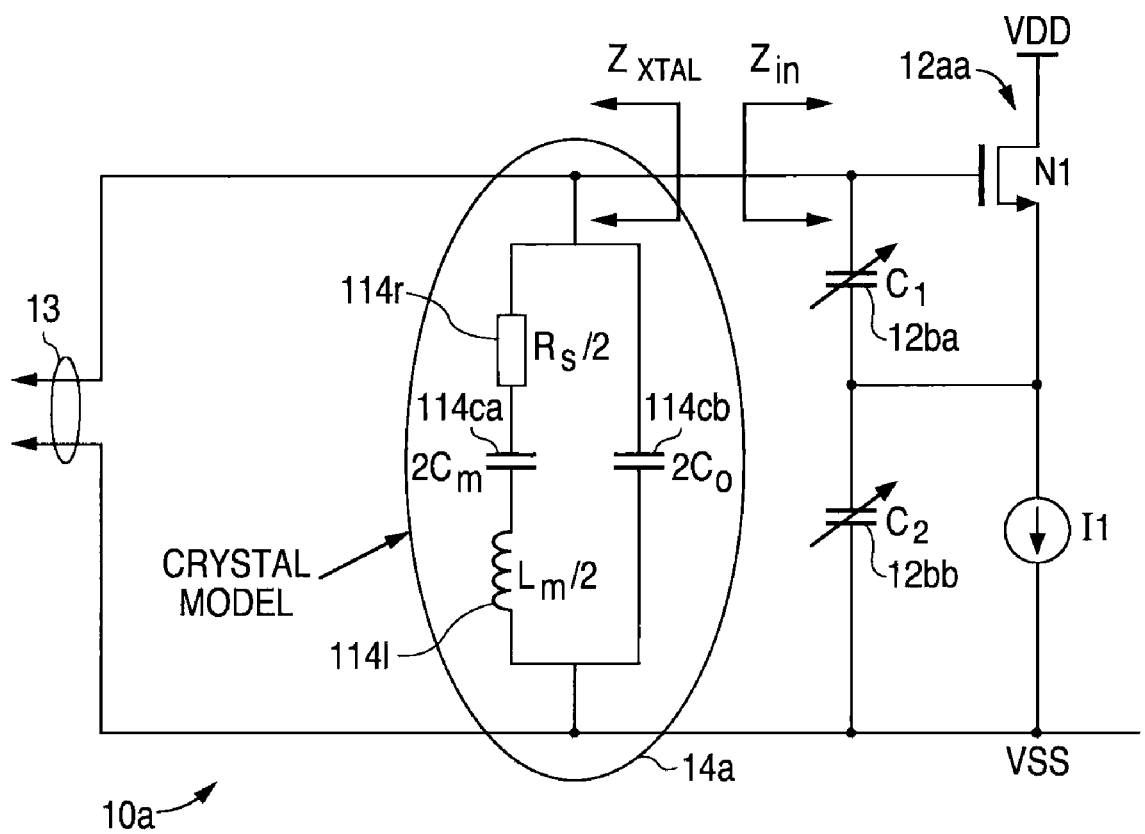
FIG. 2 is a schematic diagram of an exemplary embodiment of the oscillator of FIG. 1.

Referring to FIG. 2, in accordance with an exemplary embodiment of the presently claimed invention, the oscillator can be implemented as a Colpitts oscillator 10a with a common drain amplifier 12a including an N-type metal oxide semiconductor field effect transistor (N-MOSFET) N1 driven and a current source I1 biased between the power supply electrodes VDD, VSS. The reactive circuitry 12b is implemented as two serially coupled capacitances 12ba, 12bb having capacitance values C1 and C2, interconnected with the amplifier elements in accordance with well known Colpitts oscillator principles.

In accordance with this exemplary embodiment, the resonant circuit 14a is a crystal, which, in accordance with the well known principles of oscillator crystals, has a nominal frequency of mechanical resonance, and can be modeled as having a serially coupled resistance 114r, capacitance 114ca and inductance 114l, all of which are coupled in parallel with another capacitance 114cb, substantially as shown. At the resonant frequency of oscillation, these crystal circuit elements 114r, 114l, 114ca, 114cb will present a crystal impedance Zxtal having a real, i.e., resistive, component and an imaginary, i.e., reactive, component.

Similarly, the amplifier 12a and reactive circuitry 12b together will have an input impedance Zin, also having a resistive component and a reactive component.

In accordance with oscillator theory, it is well known that steady state, i.e., constant amplitude, oscillation is achieved when the real part Re{Zxtal} of the impedance Zxtal looking into the crystal equals the negative of the real part Re{Zin} of the impedance Zin looking into the oscillator. For the oscillator circuit 10a of FIG. 2, it can be shown that the radial frequency of oscillation $\omega_0$ can be expressed as:

$$\omega_0 = \sqrt{\frac{1}{L_m}\left(\frac{1}{C_m} + \frac{1}{C_1} + \frac{1}{C_2}\right)} \quad (1)$$

It can further be shown that the input impedance Zin of the amplifier 12a and reactive circuitry 12b can be expressed as:

$$Z_{in} = \frac{1}{j\omega C_1} + \frac{1}{j\omega C_2} - \frac{G_m}{\omega_0^2 \cdot C_1 \cdot C_2} \quad (2)$$

Hence, the real part Re{Zin} of the input impedance Zin can be expressed as follows (where Gm is the large signal transconductance of the transistor N1):

$$\text{Re}\{Z_{in}\} = -\frac{G_m}{\omega_0^2 \cdot C_1 \cdot C_2} = \frac{G_m L}{C_1 + C_2 + \frac{C_1 C_2}{C_m}} \quad (3)$$

Referring back to equation (1), since the inductance Lm and capacitance Cm of the crystal 14a are fixed parameters, tuning the oscillation frequency $\omega_0$ of the oscillator 10a requires changing either or both of the reactive circuit elements 12ba, 12bb, i.e., changing one or both of the capacitance values C1, C2. This is typically achieved by implementing the capacitances C1, C2 as voltage controlled varactors or digitally switched capacitor banks, both of which are well known in the art.

Referring back to equation (3), it can be seen that any change in the value of capacitance C1 or capacitance C2 will produce a change in the value of the real part Re{Zin} of the input impedance Zin. Since steady state oscillation requires mutually equal real parts of the input impedance and crystal impedance, i.e., Re{Zin}=Re{Zxtal}, steady state oscillation will not be achieved until the real part Re{Zin} of the input impedance returns to its previous value, since the real part Re{Zxtal} of the crystal impedance remains unchanged during changes in the tunable capacitances C1, C2. This return of the real part of the input impedance to its previous value occurs through the feedback mechanism of the oscillator amplifier 12a due to the connection of the common electrode connecting the capacitors 12ba, 12bb and the common electrode connecting the transistor N1 and current source I1, the result of which is a change in the transconductance Gm of the transistor N1. Thus, in accordance with equation (3), the real part Re{Zin} of the input impedance is restored to its previous value.

This change in the transconductance Gm via this feedback mechanism will cause the oscillation amplitude to change with a change in the frequency of oscillation $\omega_0$. However, notwithstanding this feedback mechanism, changes in the transconductance Gm can be prevented while maintaining equality of the real parts Re{Zin}, Re{Zxtal} of the impedances by changing the capacitances C1, C2 simultaneously in a prescribed manner. Hence, the frequency of oscillation $\omega_0$ can be changed while keeping the real parts Re{Zin}, Re{Zxtal} of the impedances and transconductance Gm constant, as well as the oscillation amplitude. To achieve this, it is necessary that the capacitances C1, C2 are changed simultaneously in accordance with the following relationship:

$$\frac{\Delta C_2}{\Delta C_1} = -\frac{C_m + C_2}{C_m + C_1} \approx -\frac{C_2}{C_1} \quad (4)$$

This relationship is found by assuming small changes in the capacitances C1, C2 and setting the change in the real part Re{Zin} of the input impedance equal to zero in accordance with on the following relationships:

$$Z_{in} = \frac{1}{j\omega C_1} + \frac{1}{j\omega C_2} - \frac{g_m}{\omega_0^2 \cdot C_1 \cdot C_2} \Rightarrow \text{Re}\{Z_{in}\} = \frac{g_m L}{C_1 + C_2 + \frac{C_1 C_2}{C_m}} \quad (5)$$

$$\omega_0 = \sqrt{\frac{1}{L}\left(\frac{1}{C_m} + \frac{1}{C_1} + \frac{1}{C_2}\right)}$$

From this it can be seen that the following result is necessary:

$$\Delta \text{Re}\{Z_{in}\}=0 \quad (6)$$

In order to achieve this result, it is necessary that:

$$\Delta\left(C_1 + C_2 + \frac{C_1 C_2}{C_m}\right) = 0 \quad (7)$$

Equation (7) can be alternatively expressed as:

$$\Delta\left(C_1 + C_2 + \frac{C_1 C_2}{C_m}\right) = \left(1 + \frac{C_2}{C_m}\right)\Delta C_1 + \left(1 + \frac{C_1}{C_m}\right)\Delta C_2 = 0 \quad (8)$$

This can be simplified to:

$$\Rightarrow \frac{\Delta C_2}{\Delta C_1} = -\frac{C_m + C_2}{C_m + C_1} \approx -\frac{C_2}{C_1} \quad (9)$$

Figure 3:
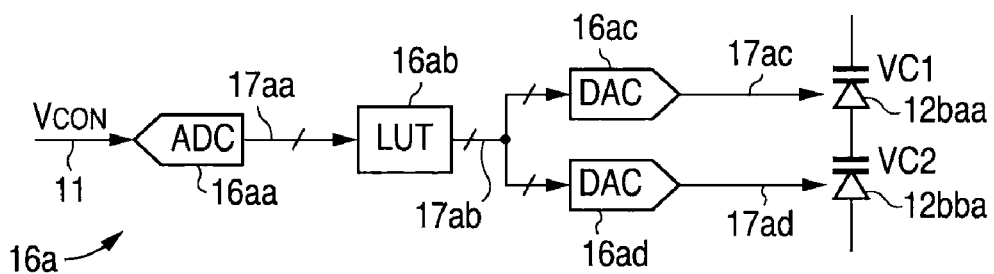
FIG. 3 is functional block diagram of an exemplary embodiment of the control circuitry and controllable reactance of the oscillator of FIG. 1.

Referring to FIG. 3, in accordance with an exemplary embodiment of the presently claimed invention, an exemplary embodiment 16a of the control circuit 16 of FIG. 1 includes an analog-to-digital converter (ADC) 16aa, a data storage circuit such as a lookup table (LUT) 16ab, and two digital-to-analog converters (DACs) 16ac, 16ad. The analog control signal 11 is converted by the ADC 16aa to provide control (e.g., addressing) signals 17aa for the LUT 16ab. The resulting data signals 17ab provided by the LUT 16ab are converted by the DACs 16ac, 16ad to analog control signals 17ac, 17ad for the controllable capacitors 12baa, 12bba, which can be implemented as varactors VC1, VC2.

Figure 4:
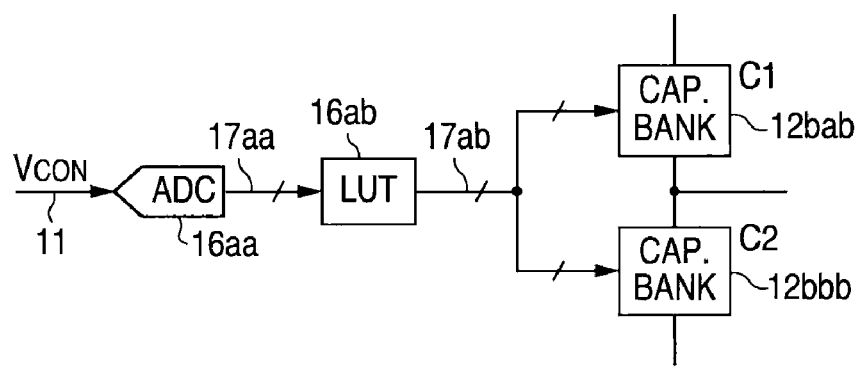
FIG. 4 is functional block diagram of another exemplary embodiment of the control circuitry and controllable reactance of the oscillator of FIG. 1.

Referring to FIG. 4, in accordance with another exemplary embodiment of the presently claimed invention, another exemplary embodiment 16b of the control circuit of 16 of FIG. 1 is the ADC 16aa and LUT 16ab. The analog control signal 11 is converted by the ADC 16aa to provide the control (e.g., addressing) signals 17aa for the LUT 16ab. The resulting data signals 17ab provided by the LUT 16ab are used to control digitally switched capacitor banks 12bab, 12bbb used to implement the controllable capacitances C1, C2.

It will be readily appreciated that the original frequency control signal can be in the form of an analog control signal 11, as shown, or in the form of the digital signal 17aa, as also shown. In any event, the digital signal 17aa is ultimately needed to address the LUT 16ab in which is stored appropriate data for controlling the varactors 12baa, 12bba (following conversion to corresponding analog voltages 17ac, 17ad) or capacitor banks 12bab, 12bbb so as to tune the values of the controllable capacitances C1, C2 in accordance with Equation (9).

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an oscillator for providing an oscillation signal with a controllable frequency, comprising:
   resonant circuitry having an impedance with resistive and reactive components;
   amplifier circuitry coupled to said resonant circuitry, including controllable reactive feedback circuitry providing controllable feedback reactance for said amplifier circuitry, and having an impedance with resistive and reactive components, wherein said controllable reactive feedback circuitry includes first and second serially coupled controllable capacitances having a first value C1 and a second value C2, respectively, that are controllable in response to one or more capacitance control signals; and
   capacitance control circuitry coupled to said controllable reactive feedback circuitry to provide said one or more capacitance control signals with a plurality of values, wherein in accordance with a change between first and second ones of said plurality of control signal values,
      said first capacitance value C1 changes from a first initial value C1a to a first subsequent value C1b for a first value change of C1b-C1a,
      said second capacitance value C2 changes from a second initial value C2a to a second subsequent value C2b for a second value change of C2b-C2a,
      a ratio (C2b-C2a)/(C1b-C1a) of said first and second capacitance value changes is approximately equal to a negative ratio (−C2)/(C1) of said first and second capacitance values, and
      said resistive component of said amplifier circuitry impedance remains substantially equal in magnitude to said resistive component of said resonant circuitry impedance.

2. The apparatus of claim 1, wherein said resonant circuitry comprises a crystal having a nominal frequency of mechanical resonance and said impedance with resistive and reactive components.

3. An apparatus including an oscillator for providing an oscillation signal with a controllable frequency, comprising:
   resonant circuitry;
   amplifier circuitry coupled to said resonant circuitry and including first and second serially coupled controllable capacitances providing controllable feedback reactance for said amplifier circuitry and responsive to one or more capacitance control signals; and
   capacitance control circuitry coupled to said controllable capacitances to provide said one or more capacitance control signals with a plurality of values, wherein
      said first and second serially coupled controllable capacitances have a first value C1 and a second value C2, respectively,
      in accordance with a change between first and second ones of said plurality of capacitance control signal values, said first capacitance value C1 changes from a first initial value C1a to a first subsequent value C1b for a first value change of C1b-C1a, and said second capacitance value C2 changes from a second initial value C2a to a second subsequent value C2b for a second value change of C2b-C2a,
      a ratio (C2b-C2a)/(C1b-C1a) of said first and second capacitance value changes is approximately equal to a negative ratio (−C2)/(C1) of said first and second capacitance values, and
      for each one of said plurality of control signal values said first and second serially coupled controllable capacitances together have a reactance with a corresponding magnitude such that said amplifier circuitry provides an oscillation signal with a substantially constant steady state magnitude.

4. The apparatus of claim 3, wherein said resonant circuitry comprises a crystal having a nominal frequency of mechanical resonance.

5. A method for providing an oscillation signal with a controllable frequency using resonant circuitry and amplifier circuitry, comprising:

provide feedback reactance control for said amplifier circuitry using first and second serially coupled controllable capacitances responsive to one or more capacitance control signals; and providing said one or more capacitance control signals with a plurality of values, wherein said first and second serially coupled controllable capacitances have a first value C1 and a second value C2, respectively, in accordance with a change between first and second ones of said plurality of capacitance control signal values, said first capacitance value C1 changes from a first initial value C1$a$ to a first subsequent value C1$b$ for a first value change of C1$b$-C1$a$, and said second capacitance value C2 changes from a second initial value C2$a$ to a second subsequent value C2$b$ for a second value change of C2$b$-C2$a$, a ratio (C2$b$-C2$a$)/(C1$b$-C1$a$) of said first and second capacitance value changes is approximately equal to a negative ratio (−C2)/(C1) of said first and second capacitance values, and for each one of said plurality of control signal values said first and second serially coupled controllable capacitances together have a reactance with a corresponding magnitude such that said amplifier circuitry provides an oscillation signal with a substantially constant steady state magnitude.

* * * * *